United States Patent
Kim et al.

(10) Patent No.: US 9,139,914 B2
(45) Date of Patent: Sep. 22, 2015

(54) THREE-DIMENSIONAL COPPER NANOSTRUCTURE AND FABRICATION METHOD THEREOF

(71) Applicant: Ajou University Industry-Academic Cooperation Foundation, Suwon, Gyeonggi-Do (KR)

(72) Inventors: Chang-Koo Kim, Seoul (KR); Sung-Woon Cho, Gyeonggi-Do (KR)

(73) Assignee: Ajou University Industry-Academic Cooperation Foundation, Suwon, Gyeonggi-do (KR)

( * ) Notice: Subject to any disclaimer, the term of this patent is extended or adjusted under 35 U.S.C. 154(b) by 0 days.

(21) Appl. No.: 14/259,628

(22) Filed: Apr. 23, 2014

(65) Prior Publication Data

US 2015/0037597 A1    Feb. 5, 2015

(30) Foreign Application Priority Data

Jul. 31, 2013   (KR) .......................... 10-2013-0090733

(51) Int. Cl.
| | |
|---|---|
| H01L 21/00 | (2006.01) |
| C23F 1/12 | (2006.01) |
| B22F 1/00 | (2006.01) |
| C23C 18/16 | (2006.01) |
| C23C 18/18 | (2006.01) |
| C23C 18/40 | (2006.01) |
| H01L 21/288 | (2006.01) |
| C23F 4/00 | (2006.01) |

(52) U.S. Cl.
CPC ................. *C23F 1/12* (2013.01); *B22F 1/0044* (2013.01); *C23C 18/1605* (2013.01); *C23C 18/1657* (2013.01); *C23C 18/1893* (2013.01); *C23C 18/405* (2013.01); *C23F 4/00* (2013.01); *H01L 21/288* (2013.01); *B22F 2304/05* (2013.01); *H01J 2237/0203* (2013.01); *H01J 2237/3341* (2013.01)

(58) Field of Classification Search
CPC ........................... C23F 1/12; H01J 2237/3341
USPC ............................................ 257/438; 438/48
See application file for complete search history.

(56) References Cited

FOREIGN PATENT DOCUMENTS

| | | |
|---|---|---|
| KR | 10-0281241 B1 | 11/2000 |
| KR | 10-0364207 B1 | 6/2003 |
| KR | 10-2012-0033875 A1 | 4/2012 |

*Primary Examiner* — Anthony Ho
(74) *Attorney, Agent, or Firm* — Mintz Levin Cohn Ferris Glovsky and Popeo, P.C.; Kongsik Kim; Jonathon Western

(57) ABSTRACT

This invention relates to a method of fabricating a three-dimensional copper nanostructure, including manufacturing a specimen configured to include a $SiO_2$ mask; performing multi-directional slanted plasma etching to form a three-dimensional etching structure layer on the specimen; performing plating so that a multi-directional slanted plasma etched portion of the specimen is filled with a metal; removing an over-plated portion and the $SiO_2$ mask from the metal layer; and removing a portion of a surface of the specimen other than the metal which is the three-dimensional etching structure layer. In this invention, a uniform copper nanostructure array can be obtained by subjecting a large-area specimen disposed in a Faraday cage to multi-directional slanted plasma etching using high-density plasma, forming a copper film on the etched portion of the specimen, and removing an over-plated copper film and the $SiO_2$ mask, and the diameter of the copper nanostructure can be arbitrarily adjusted, thus attaining high applicability.

7 Claims, 14 Drawing Sheets

F I G 1
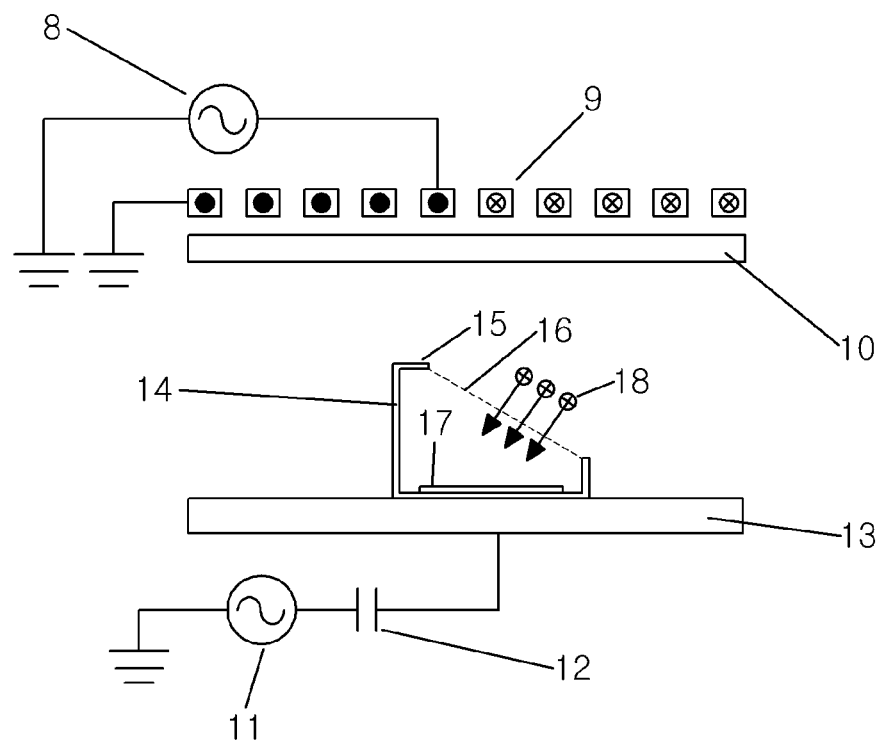

F I G 2
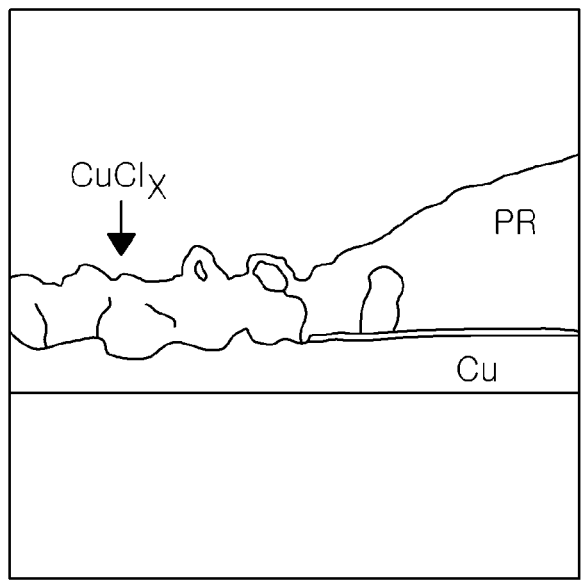

F I G 3
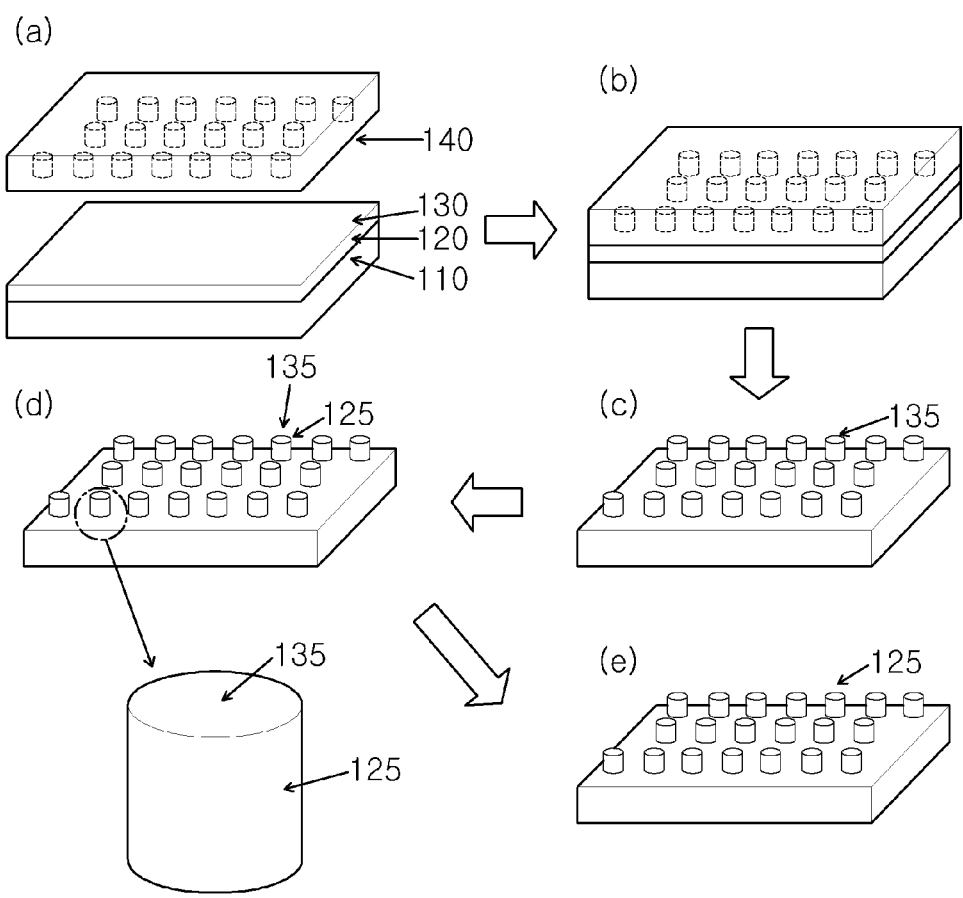

F I G 8
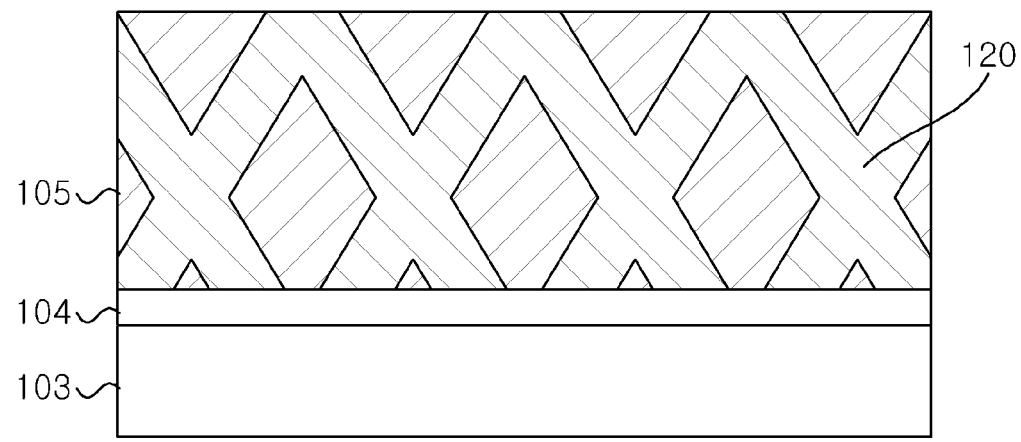

F I G 10
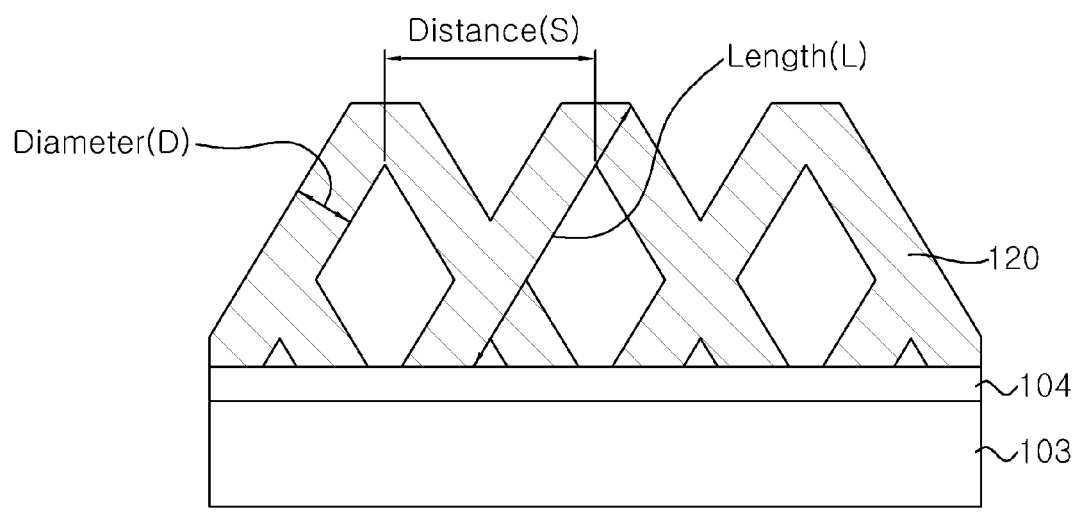

F I G 13
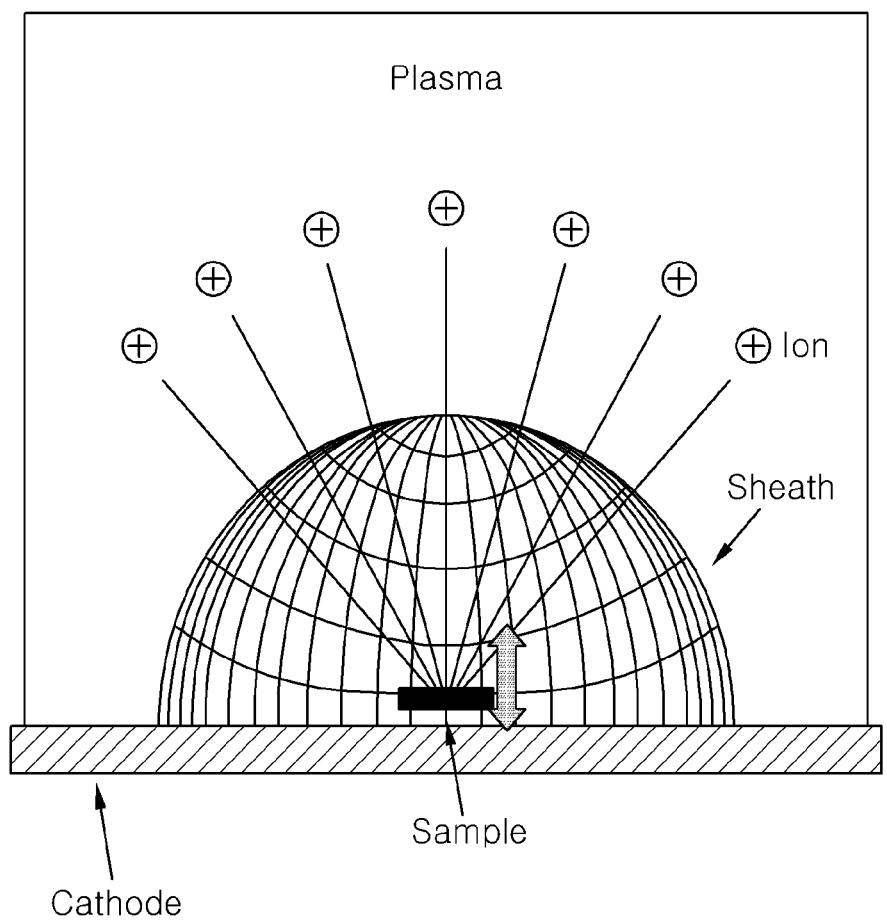

F I G 14
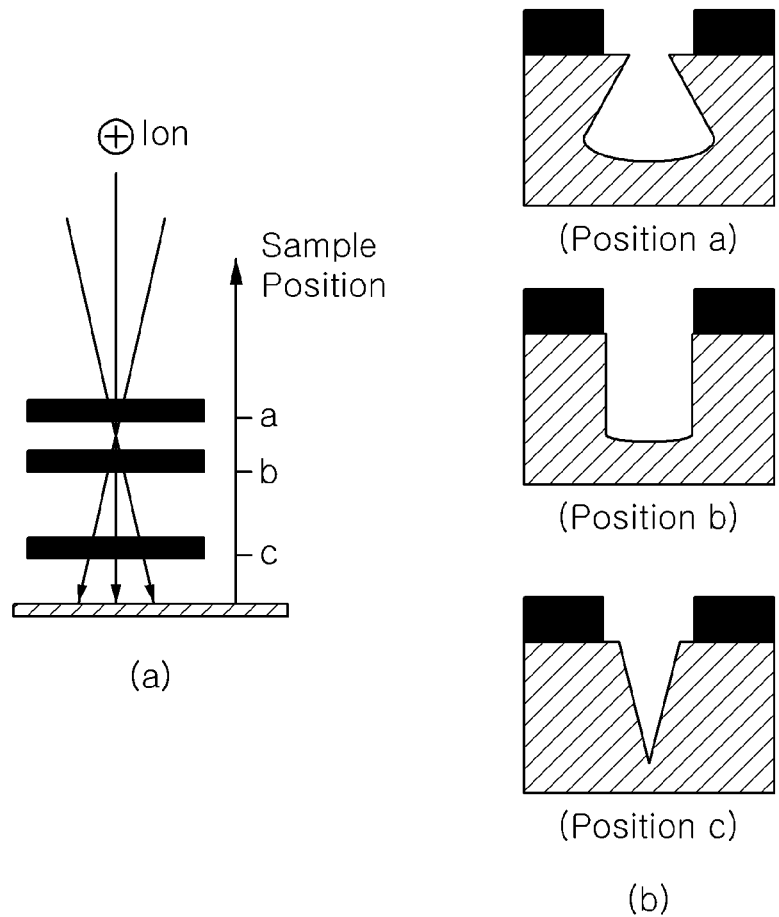

THREE-DIMENSIONAL COPPER NANOSTRUCTURE AND FABRICATION METHOD THEREOF

CROSS-REFERENCE TO RELATED APPLICATIONS

This application claims under 35 U.S.C. §119(a) the benefit of Korean Application No. 10-2013-0090733 filed on Jul. 31, 2013, which is incorporated herein by reference.

TECHNICAL FIELD

The present invention relates to a three-dimensional copper nanostructure and a fabrication method thereof, and more particularly, to a three-dimensional copper nanostructure and a fabrication method thereof, wherein a three-dimensional copper nanostructure layer may be fabricated without the use of conventional focused ion beam etching (FIBE).

This invention is an offshoot of research performed as part of the support for researchers by the Ministry of Education and the Science Technology and National Research Foundation in Korea [Project Management No.: 1345191908, Project Title: Multi-directional slanted plasma etching for template-less direct patterning of three-dimensional high-aspect ratio microstructure].

BACKGROUND ART

Three-dimensional nanostructures are widely utilized in a variety of fields including not only semiconductor-based microelectromechanical systems (MEMS), but also photonic crystal devices, display devices, etc.

Focused ion beam etching (FIBE) which is a kind of method for fabricating three-dimensional nanostructures enables ions formed in plasma to be accelerated, separately extracted and then focused so as to etch a specific portion of the substrate.

Because this method allows for the independent control of etching parameters, including the ion beam direction, ion flux, ion energy, etc., it has been extensively used in three-dimensional nanostructure fabrication. Also, a specimen may be etched using the physical energy of ions, advantageously forming three-dimensional nanostructures regardless of the type of specimen.

Copper, having high electrical conductivity, is being utilized in a variety of structures depending on the application purposes. Recently, thorough research into manufacturing micro-devices using three-dimensional copper nanostructures is ongoing. Three-dimensional copper nanostructures may be employed in cathodes for supercapacitors, secondary batteries or gas sensors, and may be applied in diverse fields, including MEMS (MicroElectroMechanical Systems), photonic crystal devices, etc.

To fabricate a three-dimensional copper nanostructure, controlling the angle and the aspect ratio of the nanostructure is essential. Ion beam etching for patterning a specimen using the physical energy of particles has been employed to date. The ion beam etching method is problematic because of ion implantation due to high bombardment energy of ions, lattice defects of a specimen, etching shape distortion due to re-deposition of sputtered particles, etc. Furthermore, this method makes it impossible to manufacture a large-area structure and is thus unsuitable for use in commercialization.

The techniques related with nanostructure fabrication are disclosed in Korean Patent Nos. 0281241 and 1249981, which are referred to as "Conventional Technique 1" and "Conventional Technique 2," respectively.

Below is a description of a plasma etching method using a Faraday cage with the upper grid plane of various geometries, and a three-dimensional nanostructure and a fabrication method thereof, as disclosed in Korean Patent Nos. 0281241 and 1249981.

FIG. 1 is a cross-sectional view illustrating an etching device wherein a Faraday cage having a grid plane slanted relative to a substrate is brought into electrical contact with the cathode of a TCP plasma etching reactor, according to Conventional Technique 1.

With reference to FIG. 1, the etching method using a Faraday cage 14 enables a substrate to be comparatively simply patterned under high-density plasma conditions, giving a slanted etch profile. The Faraday cage 14 refers to a closed space made of a conductor. When the Faraday cage 14 is provided in plasma, a sheath is formed on the outer surface of the cage, and an electric field is maintained constant therein. As such, when the top of the cage is replaced with a fine grid, the sheath is formed along the surface of the grid. Thus, the ions, which are accelerated in the sheath formed horizontally to the surface of the grid, are incident into the cage and then arrive at the substrate while the incident directionality thereof is maintained. Thus, when the specimen is disposed at different specimen holder gradients, the ion incident angle may be arbitrarily adjusted. The use of such a Faraday cage 14 may advantageously result in one-step fabrication of a slanted etching structure.

However, the etching method using the Faraday cage 14 according to Conventional Technique 1 is disadvantageous because it may be applied when only a material which may be etched with plasma is used as a target.

For example, as illustrated in FIG. 2, in the case where copper is etched using plasma, a volatile copper compound cannot be formed, and thus etching does not take place. Thus, methods of fabricating three-dimensional copper nanostructures using plasma have not yet been introduced, and no solutions have been found to date.

FIG. 3 illustrates a process of fabricating a three-dimensional nanostructure according to Conventional Technique 2. As illustrated in FIG. 3, the method of fabricating the three-dimensional nanostructure according to Conventional Technique 2 includes (a) sequentially forming a target layer 120 and a polymer layer 130 on a substrate 110; (b) performing lithography on the polymer layer 130 to form a patterned polymer structure 135; (c) subjecting the target layer 120 to ion etching, thus forming a target-polymer composite 150 in which the ion etched target is attached to the outer surface of the polymer structure 135; and (d) removing the polymer from the target-polymer composite 150, thus manufacturing a three-dimensional nanostructure 200.

However, the three-dimensional nanostructure according to Conventional Technique 2 suffers from, in the course of forming the nanostructure using ion etching, ion implantation due to high bombardment energy of ions, lattice defects of a specimen, etching shape distortion due to re-deposition of sputtered particles, etc. Additionally, this method makes it impossible to manufacture a large-area structure and is thus inappropriate for commercialization.

SUMMARY OF THE DISCLOSURE

Accordingly, the present invention has been made keeping in mind the above problems encountered in the related art, and an object of the present invention is to provide a three-dimensional copper nanostructure and a fabrication method thereof, wherein, in order to overcome limitations of conventional copper nanostructure fabrication using focused ion beam etching (FIBE), a uniform copper nanostructure array may be fabricated by subjecting a large-area specimen disposed in a Faraday cage to multi-directional slanted plasma etching using high-density plasma, forming a copper film on the etched portion of the specimen, and removing an over-plated copper film and a $SiO_2$ mask.

Another object of the present invention is to provide a three-dimensional copper nanostructure and a fabrication method thereof, wherein high applicability may be attained by arbitrarily adjusting the diameter of the copper nanostructure.

A further object of the present invention is to provide a three-dimensional copper nanostructure and a fabrication method thereof, wherein the etching shape may be controlled depending on the ion focusing point by adjusting the height of a specimen in a Faraday cage upon multi-directional slanted plasma etching.

In order to accomplish the above objects, the present invention provides a method of fabricating a three-dimensional copper nanostructure, comprising manufacturing a specimen configured to include a $SiO_2$ mask; performing multi-directional slanted plasma etching to form a three-dimensional etching structure layer on the specimen; performing plating so that a multi-directional slanted plasma etched portion of the specimen is filled with a metal to form a metal layer; removing an over-plated portion and the $SiO_2$ mask from the metal layer; and removing a portion of a surface of the specimen other than the metal which is the three-dimensional etching structure layer.

Also in the present invention, the multi-directional slanted plasma etching may be performed by subjecting the specimen to multi-directional slanted plasma etching using a Faraday cage.

Also in the present invention, the multi-directional slanted plasma etching may be carried out by changing an ion irradiation direction or by changing an ion irradiation direction and rotating the specimen.

Also in the present invention, the plating may be performed by electroless plating.

Also in the present invention, the removing the over-plated portion and the $SiO_2$ mask from the metal layer may be performed using chemical mechanical polishing.

Also in the present invention, the metal layer may comprise any one selected from among copper (Cu), tungsten (W), cobalt (Co), silver (Ag), gold (Au), platinum (Pt) and nickel (Ni).

Also in the multi-directional slanted plasma etching, an etching shape may be controlled depending on an ion focusing point by adjusting the height of the specimen in the Faraday cage.

In addition, the present invention provides a three-dimensional copper nanostructure, comprising a silicon wafer; a $SiO_2$ etch stop layer formed on the silicon wafer; and a nanostructure layer formed on the $SiO_2$ etch stop layer using multi-directional slanted plasma etching.

Also in the present invention, the slanted plasma etching may be performed using a Faraday cage.

Also in the present invention, the $SiO_2$ etch stop layer may comprise $Si_3N_4$ (silicon nitride), SiC (silicon carbide), or an amorphous carbon layer (ACL), having high etching selectivity.

Also in the present invention, the nanostructure layer may be adjusted in angle and diameter.

BRIEF DESCRIPTION OF THE DRAWINGS

The above and other objects, features and advantages of the present invention will be more clearly understood from the following detailed description taken in conjunction with the accompanying drawings, in which:

FIG. 1 is a cross-sectional view illustrating an etching device in which a Faraday cage having a grid plane slanted relative to a substrate is brought into electrical contact with the cathode of a TCP plasma etching reactor, according to Conventional Technique 1;

FIG. 2 is a view illustrating the Cu etched using $Cl_2$ plasma according to Conventional Technique 1;

FIGS. 3A to 3E are views sequentially illustrating a process of fabricating a three-dimensional nanostructure according to Conventional Technique 2;

FIG. 8 is a schematic view illustrating a step of removing over-plated copper and $SiO_2$ mask in the process of fabricating a three-dimensional copper nanostructure according to the present invention;

FIG. 10 is a front view illustrating the three-dimensional copper nanostructure formed by the process of fabricating a three-dimensional copper nanostructure according to the present invention;

FIG. 13 is a schematic view illustrating another Faraday cage used in the process of fabricating a three-dimensional copper nanostructure according to the present invention; and FIGS. 14A and 14B are enlarged views illustrating the etching shape through the ion focusing point varying at different heights of the sample when the hemispherical Faraday cage of FIG. 13 is applied to the present invention.

DETAILED DESCRIPTION OF THE DISCLOSURE

The terminologies or words used in the description and the claims of the present invention should be interpreted as the meanings and concepts of the invention in keeping with the scope of the invention based on the principle that the inventors can appropriately define the terms in order to describe the invention in the best way.

In this application, when any part "includes" any element, it means that the other elements are not excluded but may be further included unless otherwise stated. Also, the term " . . . part" herein indicates a unit able to execute at least one function or operation, which may be embodied by hardware, software, or a combination of hardware and software.

Hereinafter, a detailed description will be given of a three-dimensional copper nanostructure and a fabrication method thereof according to embodiments of the present invention, with reference to the appended drawings.

Figure 4:
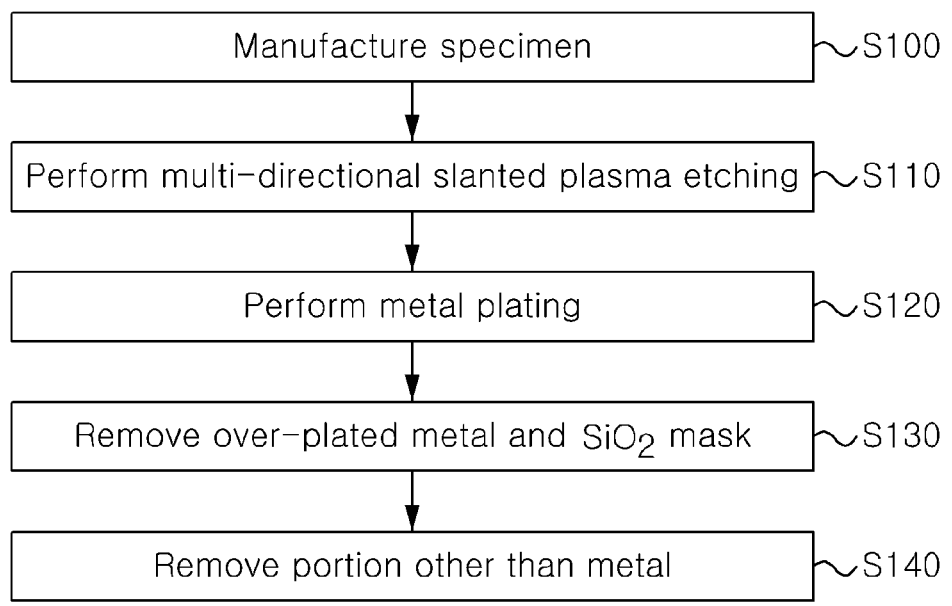
FIG. 4 is a block diagram illustrating a process of fabricating a three-dimensional copper nanostructure according to the present invention.
Figure 5:
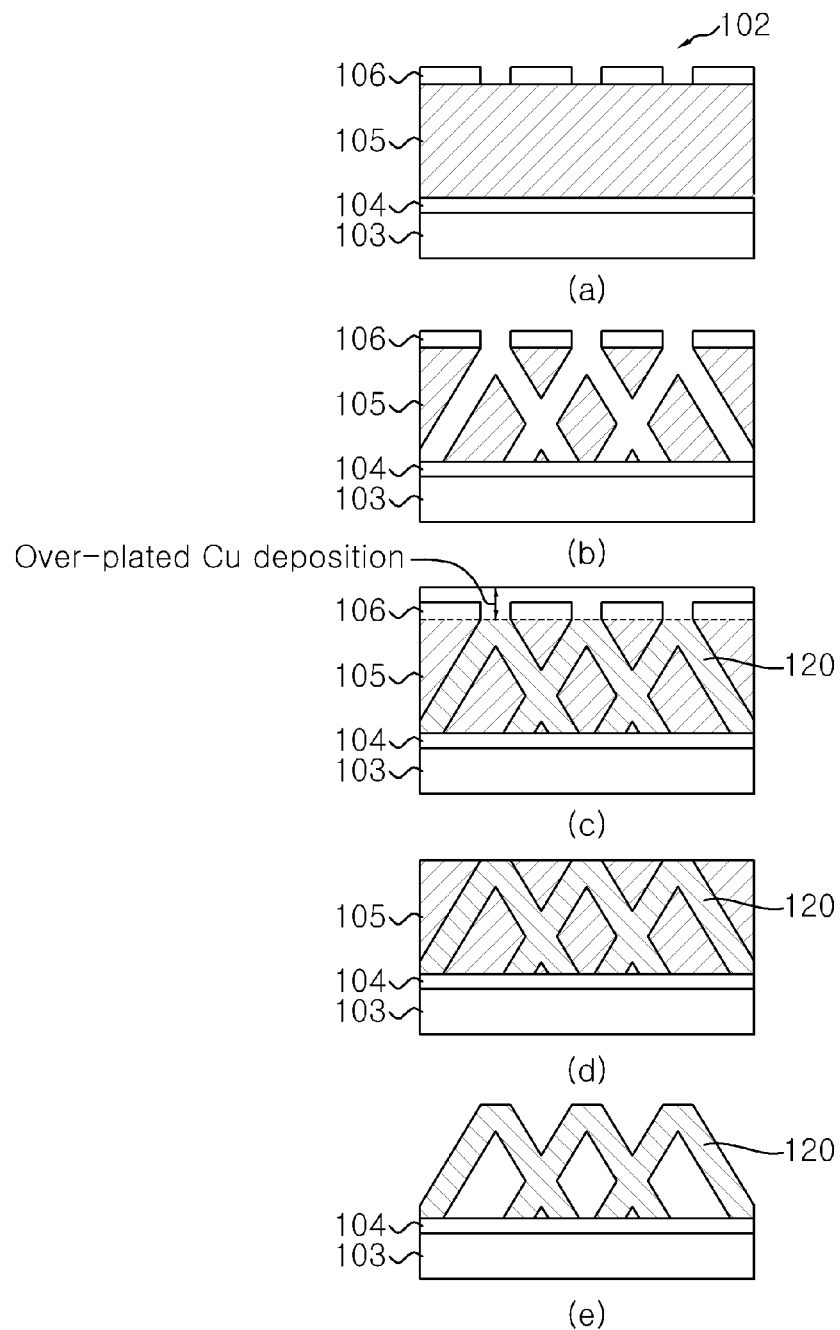
FIGS. 5A to 5E are views sequentially illustrating a process of fabricating a three-dimensional copper nanostructure according to the present invention.
Figure 6:
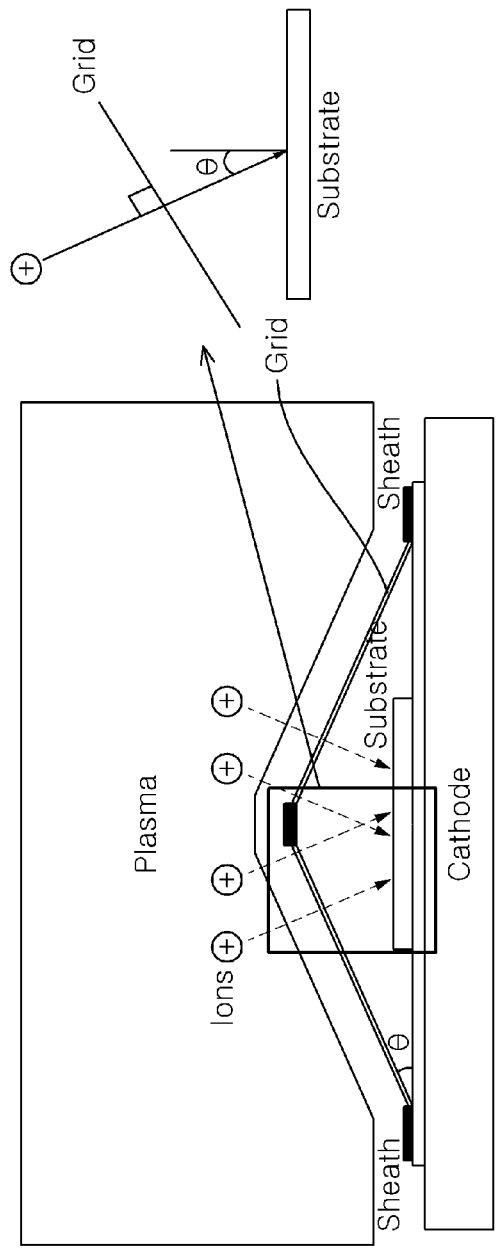
FIG. 6 is a schematic view illustrating a Faraday cage used in the process of fabricating a three-dimensional copper nanostructure according to the present invention.
Figure 7:
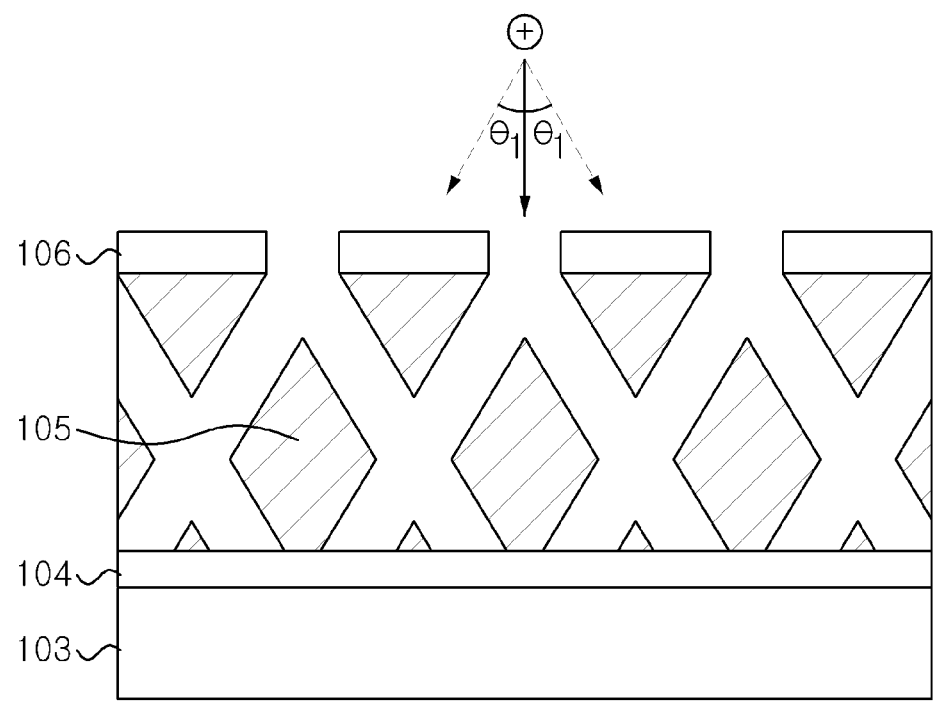
FIG. 7 is a schematic view illustrating a multi-directional slanted plasma etching step in the process of fabricating a three-dimensional copper nanostructure according to the present invention.
Figure 9:
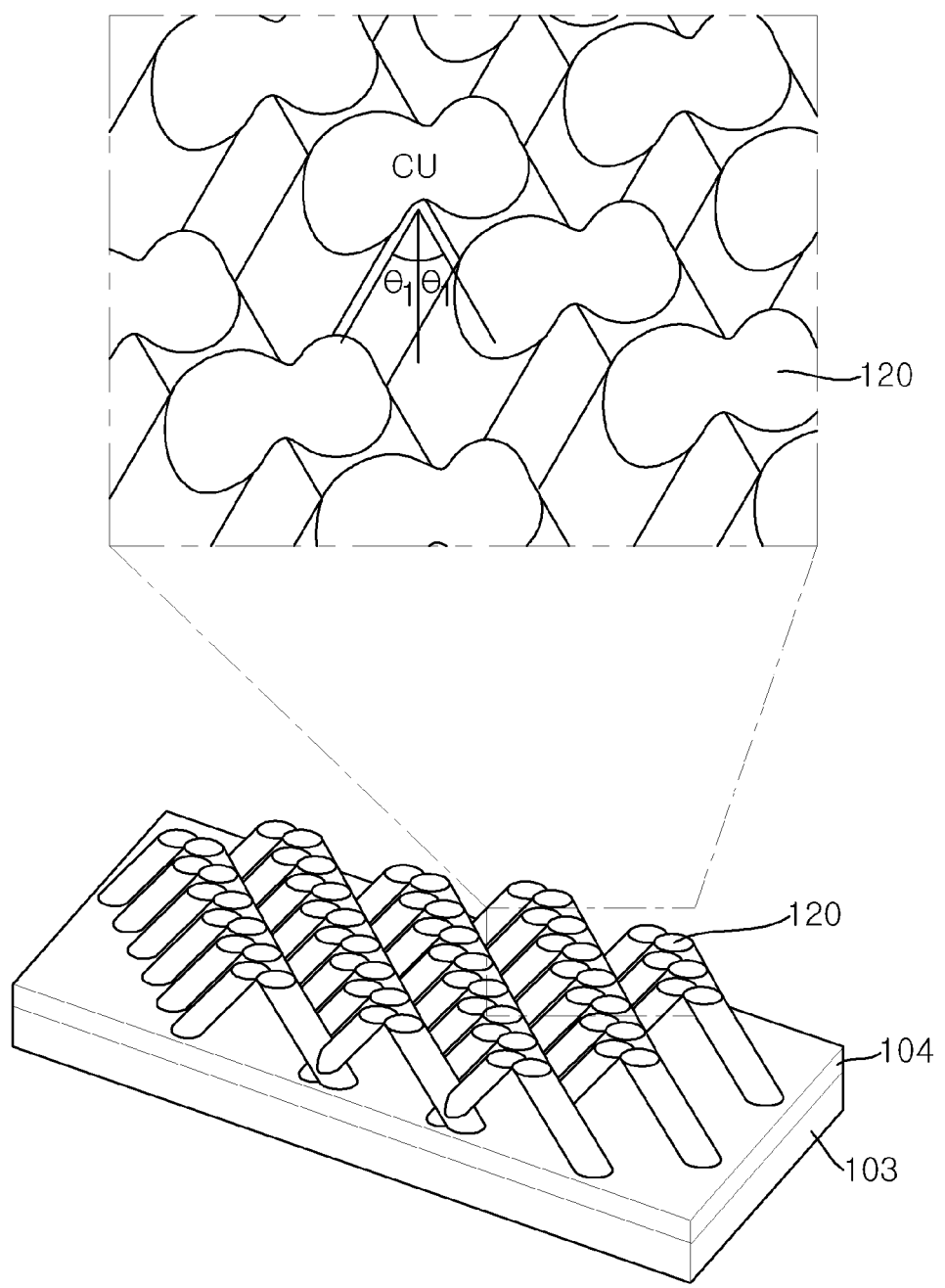
FIG. 9 is a perspective view illustrating a three-dimensional copper nanostructure formed by the process of fabricating a three-dimensional copper nanostructure according to the present invention.
Figure 11:
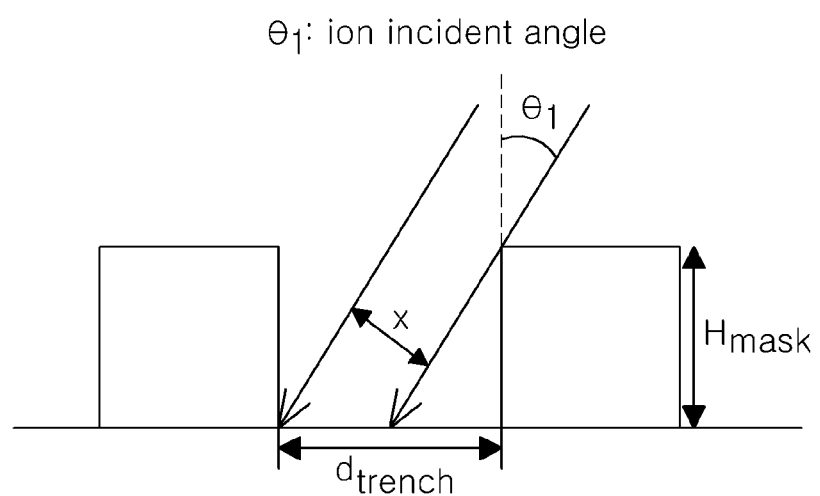
FIG. 11 is a reference view for arbitrarily adjusting the angle and the diameter of the copper nanostructure in the process of fabricating a three-dimensional copper nanostructure according to the present invention.
Figure 12:
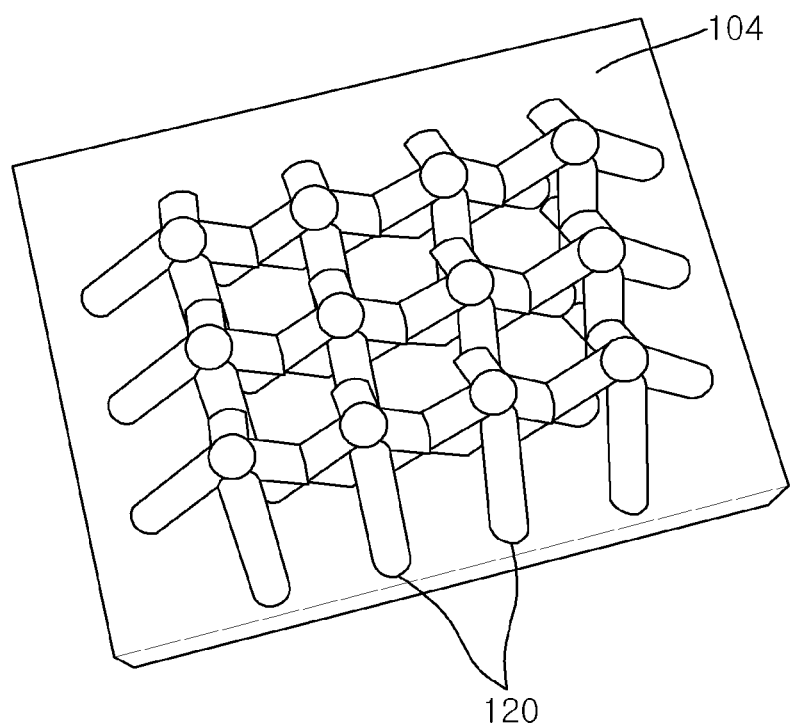
FIG. 12 is a view illustrating another three-dimensional copper nanostructure formed by the process of fabricating a three-dimensional copper nanostructure according to the present invention.

FIG. 4 is a block diagram illustrating a process of fabricating a three-dimensional copper nanostructure according to the present invention, FIGS. 5A to 5E are views sequentially illustrating a process of fabricating a three-dimensional copper nanostructure according to the present invention, FIG. 6 is a schematic view illustrating a Faraday cage used in the process of fabricating a three-dimensional copper nanostructure according to the present invention, FIG. 7 is a schematic view illustrating a multi-directional slanted plasma etching step in the process of fabricating a three-dimensional copper nanostructure according to the present invention, FIG. 8 is a schematic view illustrating a step of removing over-plated copper and $SiO_2$ mask in the process of fabricating a three-dimensional copper nanostructure according to the present invention, FIG. 9 is a perspective view illustrating a three-dimensional copper nanostructure formed by the process of fabricating a three-dimensional copper nanostructure according to the present invention, FIG. 10 is a front view illustrating the three-dimensional copper nanostructure formed by the process of fabricating a three-dimensional copper nanostructure according to the present invention, FIG. 11 is a reference view for arbitrarily adjusting the angle and the diameter of the copper nanostructure in the process of fabricating a three-dimensional copper nanostructure according to the present invention, FIG. 12 is a view illustrating another three-dimensional copper nanostructure formed by the process of fabricating a three-dimensional copper nanostructure according to the present invention, FIG. 13 is a schematic view illustrating another Faraday cage used in the process of fabricating a three-dimensional copper nanostructure according to the present invention, and FIGS. 14A and 14B are enlarged views illustrating the etching shape through the ion focusing point varying at different heights of the sample when the hemispherical Faraday cage of FIG. 13 is applied to the present invention.

As illustrated in these drawings, the method of fabricating the three-dimensional copper nanostructure according to the present invention includes manufacturing a specimen (S100), performing multi-directional slanted plasma etching (S110), performing metal plating (S120), removing an over-plated metal and a $SiO_2$ mask (S130), and removing a portion other than metal (S140).

Manufacturing the specimen (S100) is a step of manufacturing a specimen 102 configured such that a $SiO_2$ etch stop layer 104, a poly-Si layer 105 and a $SiO_2$ mask 106 are sequentially stacked on a silicon wafer 103.

Specifically, manufacturing the specimen (S100) is performed by forming the $SiO_2$ etch stop layer 104 on the silicon wafer 103 using thermal oxidation, growing the poly-Si layer 105 using chemical vapor deposition, and then patterning the $SiO_2$ mask 106, thus preparing the specimen 102.

The material for the wafer 103 such as Si may include various thin films depending on the end uses of copper nanostructures such as insulating films, semiconductors, metal thin films, etc. and the properties of the device.

The $SiO_2$ etch stop layer may be formed of a material such as $Si_3N_4$ (silicon nitride), SiC (silicon carbide), amorphous carbon layer (ACL), etc., having higher etching selectivity compared to poly-Si.

The thickness of the poly-Si layer 105 may be variously formed depending on the length of the resulting copper nanostructure layer.

The $SiO_2$ mask 106 may be formed of a material having higher etching selectivity compared to the poly-Si layer 105. Furthermore, the spacing of the $SiO_2$ mask 106 may be variously set in the range from tens of nm to ones of μm, depending on the end uses of copper nanostructures. The mask may be formed by patterning a $SiO_2$ thin film in a hole structure.

As the diameter of the $SiO_2$ mask and the height of the poly-Si layer 105 are adjusted, the aspect ratio of the three-dimensional copper nanostructure layer may be variously controlled. Herein, the aspect ratio indicates the ratio of length L and diameter D of the copper nanostructure (FIG. 10).

Furthermore, in the copper nanostructure, the diameter D, the length L and the structure spacing S are determined by the diameter and the height of the $SiO_2$ mask, the height of the poly-Si layer 105, etc. Briefly, the structural properties of the copper nanostructure are decided by the height of the poly-Si layer 105 and the diameter and the height of the $SiO_2$ mask.

The poly-Si layer 105 and the $SiO_2$ mask are manufactured using a thin film deposition process such as plasma-enhanced chemical vapor deposition (PECVD), thermal CVD, etc. As such, the thickness of the thin film may be controlled by adjusting the process parameters (deposition time, pressure, flow rate, etc.).

The diameter of the $SiO_2$ mask may be controlled by adjusting the diameter of a photomask used for an exposure process. Specifically, PR is patterned using a photomask, and $SiO_2$ is then etched using the PR mask, after which PR used as the mask is removed, thus forming the $SiO_2$ mask. Accordingly, the diameter of the $SiO_2$ mask may be adjusted depending on the initial diameter of the photomask.

Performing the multi-directional slanted plasma etching (S110) is a step of subjecting the specimen 102 to multi-directional slanted plasma etching using a Faraday cage to form a copper nanostructure layer 120 (FIGS. 6 and 7).

The Faraday cage has a prism shape, and the angle (θ) between the grid and the electrode is 0~60° (preferably 30°). Also, the ion incident angle (θ1) through the grid plane of the Faraday cage is 0~60° (preferably 30°).

Meanwhile, upon plasma etching, a sheath is formed on the surface of a substrate, and thus ions accelerated perpendicular to the equipotential line of the sheath are incident perpendicular to the substrate regardless of the slope of the substrate. Thus, the etch profile by plasma etching is limited only to a perpendicular direction to the substrate. For this reason, the plasma etching is not directly applied to form three-dimensional fine structures including a slanted pattern.

In the present invention, the ion incident angle was adjusted using a Faraday cage. The Faraday cage refers to a cage made of a conductor, and the top of the cage is provided with a fine grid. In this case, the sheath is formed on the surface of the grid and the internal potential of the cage is maintained constant. Ultimately, the ions incident into the cage through the sheath possess linearity relative to the surface of the grid, and thus the ion incident angle may be controlled by adjusting the angle between the grid and the electrode.

As illustrated in FIG. 6, the ion incident angle is defined by an angle (θ) between the perpendicular direction of a specimen and the ion incident direction. This angle is equal to the angle between the electrode (cathode) and the grid. Thus, the case where the angle (θ) between the grid and the cathode is adjusted may change the ion incident angle. In the present invention, the ion incident angle was maintained at 30° using a Faraday cage having the angle of 30° between the grid and the cathode.

The processing gas used in the multi-directional slanted etching step (S110) may include a gas ($SF_6$, $C_xF_y$ gas, $C_xH_yF_z$ gas, $SiF_4/O_2$ gas, etc.) that is able to adjust etching selectivity of the poly-Si layer 105 and the $SiO_2$ mask 106.

In particular, the multi-directional slanted plasma etching may be performed using a gas chopping process able to make an anisotropic etching shape. Upon manufacturing a microelectromechanical system (MEMS), a method of forming Si having a high aspect ratio pattern may include a gas-chopping process or a Bosch process, known as time-multiplexed deep etching. The Bosch process is a cyclic process including alternately performing etching and deposition so that a bottom etching step and a wall deposition step are repeated. The etching step is carried out using $SF_6$ plasma or the like, and the wall deposition step is conducted using $C_4F_8$ plasma, etc.

The cyclic process is implemented under the condition that the etching/deposition time is 10/4 sec in the course of repeated etching and deposition and the number of total cycles is 19.

To form an anisotropic shape upon pattern etching, the cyclic process including the bottom etching step and the wall deposition step, which are repetitively performed, is widely utilized.

In the case where hole etching is implemented with a continuous process, wall etching and bottom etching are simultaneously performed, resulting in an etching structure much beyond the anisotropic structure. However, in the case where a cyclic process is applied, a wall protecting film functions to prevent wall etching, thus forming an etching structure having superior anisotropy. On the other hand, the wall protecting film is a carbon fluoride thin film, and may be formed using a gas containing carbon fluoride (CF) such as $CF_4$, $C_4F_6$, $C_4F_8$, $CH_2F_2$, $CHF_3$, etc.

As illustrated in FIG. 6, the Faraday cage is a prism-shaped conductor cage the top of which is formed with a conductive porous grid plane, instead of a complete closed surface.

As such, a sheath is formed on the grid plane of the Faraday cage placed in plasma. Specifically, the sheath is formed on the conductive material of the grid and is also continuously formed even at the open portion of the grid. The ions accelerated in a slanted direction (θ1) to the grid plane in the sheath are incident in the cage through the open portion of the grid. Because an electric field is uniform in the cage based on the principle of a Faraday cage, the ions move in the same direction as in passing through the grid plane, and then collide with the substrate. The surface of the substrate in the cage is fixed horizontally to the grid plane and the ions are incident in a slanted direction (θ1) to the grid plane. Accordingly, etching is carried out in a slanted direction relative to the surface of the substrate. Thereby, slanted etching is possible while maintaining the high etching rate of reactive ion etching and high-density plasma etching.

Furthermore, although not shown in the drawings, a table for fixing the substrate in the Faraday cage may be rotated by a set angle by means of a driving part.

As the table is rotated by the driving part including a stepping motor or a servo motor in which the number of rotations is adjusted, the etching direction may be controlled.

Performing the metal plating (S120) is a step of plating a multi-directional slanted plasma etched portion of the specimen 102 with a metal to form a metal layer. To this end, electroless plating is applied to form a metal layer on the surface of the specimen 102, and is carried out in such a manner that the surface of the metal is pretreated with a first solution for a first processing time and then plated using a second solution including a first additive for a second processing time.

The first solution is a solution comprising 0.05~0.15 g/L (preferably 0.1 g/L) $PdCl_2$ (palladium chloride)+4~6 ml/L (preferably 50% 5 ml/L) 45~55% HF (hydrogen fluoride)+2~4 ml/L (preferably 35% 3 ml/L) 30~40% HCl (hydrochloric acid). The second solution is an aqueous solution [pH: 12.50 (a pH controller, NaOH), temperature: 85~90° C.] comprising 4~6 ml/L (preferably 5 ml/L) a surfactant {triton-X100 [2,2'-dipyridyl]} and 0.5~1.5 g/L (preferably 1 g/L) $CuSO_4.5H_2O$ (copper sulfate)+1~5 g/L (preferably 3 g/L) EDTA (ethylenediaminetetraacetic acid)+0.5~1.5 ml/L (preferably 1 ml/L) HCHO (formaldehyde)+0.02~0.06 g/190~210 ml (preferably 0.04 g/200 ml) 2,2'bipyridyl. Also, the first processing time is 35~45 sec (preferably 40 sec) and the second processing time is 4~10 min (preferably 7 min).

Upon metal plating (S120), the plating material may include any material such as copper (Cu), tungsten (W), cobalt (Co), silver (Ag), gold (Au), platinum (Pt), nickel (Ni), etc., depending on the application purposes. In the present embodiment, the plating material is exemplified by copper.

Upon removing the over-plated metal and the $SiO_2$ mask (S130), the over-plated portion and the $SiO_2$ mask 106 are removed from the metal layer using chemical mechanical polishing (CMP). Moreover, surface polishing is performed so as to completely remove the $SiO_2$ mask 106 and the over-plated metal from the surface.

Specifically, the reason why removing the over-plated metal and the $SiO_2$ mask (S130) is performed is as follows. Although only the space in the poly-Si layer 105 is filled with a metal upon forming the metal layer as illustrated in FIG. 8, the metal layer is actually formed on the pattern, and thus, the metal layer formed on the pattern has to be removed. As such, the metal formed on the pattern other than the space in the poly-Si layer 105 is referred to as an over-plated metal.

Meanwhile, the chemical mechanical polishing for removing the over-plated copper and the $SiO_2$ mask is performed under conditions of a rotation rate of 35~45 rpm (preferably 40 rpm) using a 0.5~1.1 μm (preferably 0.8 μm) alumina slurry polishing agent.

Removing the portion other than the metal (S140) is performed in such a manner that the portion of the surface of the specimen other than the metal, that is, poly-Si, is removed, so that only the three-dimensional copper nanostructure layer 120 is left behind.

Specifically, removing the portion other than the metal (S140) is carried out by heating a first solution, a second solution and a third solution at a first temperature, thus obtaining the specimen in which the $SiO_2$ mask (106) and the surface metal layer are completely removed, which is then wet etched for 60~120 sec (preferably 90 sec). As such, to remove poly-Si, plasma etching, as well as wet etching, may be applied.

As such, the first solution includes 50~150 g (preferably 100 ml) of KOH (potassium hydroxide), the second solution includes 150~250 ml (preferably 200 ml) of normal propanol, and the third solution contains 750~850 ml (preferably 800 ml) of $H_2O$ (water). In particular, the heating temperature of the first, the second and the third solution is set to 70~90° C. (preferably 80° C.)

In order to form the three-dimensional copper nanostructure layer 120 in the present invention, the three-dimensional copper nanostructure layer 120 in a uniform array may be manufactured over a large area using the Faraday cage. When using the method of the invention, it is possible to form the three-dimensional copper nanostructure layer 120 having predetermined slope and diameter.

The three-dimensional copper nanostructure includes a silicon wafer 103, a $SiO_2$ etch stop layer 104 formed on the silicon wafer 103, and a nanostructure layer 120 formed on the $SiO_2$ etch stop layer 104 using multi-directional slanted plasma etching.

The three-dimensional copper nanostructure may be easily formed over a large area by Faraday cage etching under the condition that a plurality of specimens 102 is disposed at a predetermined interval in the Faraday cage. Specifically, disposing the specimens (not shown) may be additionally performed between manufacturing the specimen (S100) and performing the multi-directional slanted plasma etching (S110), and thus the plurality of specimens 102 is disposed depending on the desired area, making it possible to form a large-area copper nanostructure.

Because the three-dimensional copper nanostructure layer 120 is formed by subjecting the specimen having a predetermined pattern to slanted etching using the Faraday cage, a uniform copper nanostructure array may result. Specifically, the copper nanostructure array is determined by the slanted etching structures, and in the case where a master specimen array is uniform, the resulting copper nanostructure is also made uniform.

Furthermore, the three-dimensional copper nanostructure layer 120 may be arbitrarily adjusted in angle and diameter. The angle of the etching structure layer may vary depending on the ion irradiation angle. Hence, when the ion irradiation angle is adjusted, the angle of the copper nanostructure may be controlled. Also, the diameter of the copper nanostructure may be manipulated by adjusting the pattern spacing of the $SiO_2$ mask 106 and the height of the mask.

As illustrated in FIG. 11, the diameter X of the copper nanostructure is determined by Equation 1 below wherein $d_{trench}$ is the spacing in the $SiO_2$ mask, $H_{mask}$ is the height of the mask and θ1 is the ion incident angle. Therefore, the diameter X of the copper nanostructure may be easily manipulated when the spacing of the mask, the height of the mask and the ion incident angle are adjusted.

$$X = \cos\theta 1 \left( d_{trench} - \frac{H_{mask}}{\cot an\theta 1} \right) \quad \text{[Equation 1]}$$

In the present invention, multi-directional slanted plasma etching is applied to form the three-dimensional copper nanostructure layer 120, and thereby a uniform three-dimensional copper nanostructure array may be manufactured.

Meanwhile, FIG. 12 illustrates another three-dimensional copper nanostructure formed by the process of fabricating a three-dimensional copper nanostructure according to the present invention.

Specifically, upon multi-directional slanted plasma etching, the ion incident angle in the Faraday cage is adjusted, thus forming a three-dimensional copper nanostructure layer 120, after which a specimen 102 is rotated by a set angle (e.g. 90°) and then multi-directional slanted plasma etching is further performed, and consequently a multiple multi-directional three-dimensional copper nanostructure 120 where the angle between the nanostructures is 90° may be fabricated using two multi-directional slanted etchings.

Although not shown, the substrate is subjected to primary etching in the Faraday cage, rotated by 60° and 120° and then subjected to secondary and tertiary etchings, thereby forming a hexagonal pyramid-shaped copper nanostructure. In the same principle, the substrate is subjected to primary etching, rotated by 45°, 90° and 135° and then subjected to respective etchings, affording an octagonal pyramid-shaped copper nanostructure. Specifically, when the rotation angle of the substrate is subdivided and multi-directional slanted etching is performed several times, copper nanostructures having various shapes may result. Ultimately, because the Faraday cage includes a table able to adjust the angle, the shape of the copper nanostructure may be controlled depending on the rotation angle of the table.

In another example of the Faraday cage, a conical or hemispherical shape other than the prism shape may be provided. In the case where a hemispherical Faraday cage is used, as illustrated in FIG. 13, the ion focusing point may vary depending on the height of the substrate (sample), and thus, a variety of etching structures having diverse shapes such as radial, vertical, inverted triangle shapes, etc. may be obtained at different focusing points.

As such, the focusing point indicates the position at which the focusing point of the incident ion is produced, and the position is changed depending on the height of the substrate as a target. Furthermore, the crossing point is generated in the ion incident direction, and the etching shape varies depending on the position of the substrate, that is, depending on whether the substrate is positioned above or below the crossing point or is positioned at the crossing point.

As illustrated in FIG. 14A, when the substrate is located at Position a above the crossing point, the ion focusing point is generated at Position a, and thus, as illustrated in FIG. 14B, etching is performed in a radial shape as in Position a. When the substrate is located at Position b corresponding to the crossing point, the ion focusing point is generated at Position b and thus etching is performed in a vertical shape as in Position b. When the substrate is located at Position c below the crossing point, the ion focusing point is generated at Position c, and thus etching is conducted in an inverted triangle shape as in Position c.

As such, the table for fixing the substrate in the Faraday cage may be lift by a lifting driving part to which a cylinder or the like is applied.

As described hereinbefore, the present invention provides a three-dimensional copper nanostructure and a fabrication method thereof. According to the present invention, in order to overcome limitations of conventional copper nanostructure fabrication using focused ion beam etching (FIBE), a uniform copper nanostructure array can be formed by subjecting a large-area specimen disposed in a Faraday cage to multi-directional slanted plasma etching using high-density plasma, forming a copper film on the etched portion of the specimen, and removing an over-plated copper film and a $SiO_2$ mask. Also, the diameter of the copper nanostructure layer can be arbitrarily adjusted, thus attaining high applicability.

Although the embodiments of the present invention have been disclosed for illustrative purposes, those skilled in the art will appreciate that a variety of different modifications, additions and substitutions are possible, without departing from the scope and spirit of the invention as disclosed in the accompanying claims.

Accordingly, such modifications, additions and substitutions should also be understood as falling within the scope of the present invention.

What is claimed is:

1. A method of fabricating a three-dimensional copper nano structure, comprising:
    manufacturing a specimen configured to include a $SiO_2$ mask;

performing multi-directional slanted plasma etching to form a three-dimensional etching structure layer on the specimen;

performing plating so that a multi-directional slanted plasma etched portion of the specimen is filled with a metal to form a metal layer;

removing an over-plated portion and the $SiO_2$ mask from the metal layer; and removing a portion of a surface of the specimen other than the metal which is the three-dimensional etching structure layer.

2. The method of claim 1, wherein the multi-directional slanted plasma etching is performed by subjecting the specimen to multi-directional slanted plasma etching using a Faraday cage.

3. The method of claim 2, wherein the multi-directional slanted plasma etching is carried out by changing an ion irradiation direction or by changing an ion irradiation direction and rotating the specimen.

4. The method of claim 1, wherein the plating is performed by electroless plating.

5. The method of claim 1, wherein the removing the over-plated portion and the $SiO_2$ mask from the metal layer is performed using chemical mechanical polishing.

6. The method of claim 1, wherein the metal layer comprises any one selected from among copper (Cu), tungsten (W), cobalt (Co), silver (Ag), gold (Au), platinum (Pt) and nickel (Ni).

7. The method of claim 2, wherein in the multi-directional slanted plasma etching, an etching shape is controlled depending on an ion focusing point by adjusting a height of the specimen in the Faraday cage.

* * * * *